United States Patent
Hsu et al.

(10) Patent No.: US 8,142,686 B2
(45) Date of Patent: Mar. 27, 2012

(54) ELECTRICALLY CONDUCTIVE POLYMER COMPOSITIONS

(75) Inventors: Che-Hsiung Hsu, Wilmington, DE (US); Hong Meng, Wilmington, DE (US); Yulong Shen, Wilmington, DE (US); Ming Zheng, Wilmington (DE)

(73) Assignee: E.I. du Pont de Nemours and Company, Wilmington, DE (US)

( * ) Notice: Subject to any disclaimer, the term of this patent is extended or adjusted under 35 U.S.C. 154(b) by 104 days.

(21) Appl. No.: 12/633,903

(22) Filed: Dec. 9, 2009

(65) Prior Publication Data

US 2011/0049431 A1   Mar. 3, 2011

Related U.S. Application Data

(60) Provisional application No. 61/120,923, filed on Dec. 9, 2008.

(51) Int. Cl.
*H01B 1/00* (2006.01)
*C08G 75/00* (2006.01)
*C08G 73/06* (2006.01)

(52) U.S. Cl. .................. 252/500; 528/377; 528/423

(58) Field of Classification Search .................. 252/500; 528/377, 423
See application file for complete search history.

(56) References Cited

U.S. PATENT DOCUMENTS

| | | |
|---|---|---|
| 3,282,875 A | 11/1966 | Connolly et al. |
| 4,358,545 A | 11/1982 | Ezzell et al. |
| 4,433,082 A | 2/1984 | Grot |
| 4,940,525 A | 7/1990 | Ezzell et al. |
| 5,300,575 A | 4/1994 | Jonas et al. |
| 5,463,005 A | 10/1995 | Desmarteau |

(Continued)

FOREIGN PATENT DOCUMENTS

EP   1026152 A1   6/2001

(Continued)

OTHER PUBLICATIONS

A Feiring et al, J Fluorine Chemistry 2000, 105, 129-135.

(Continued)

*Primary Examiner* — Mark Kopec
*Assistant Examiner* — Jaison Thomas

(57) ABSTRACT

The present invention relates to electrically conductive polymer compositions, and their use in organic electronic devices. The electrically conductive polymer compositions include an intrinsically conductive polymer having at least one monomer unit derived from Formula I:

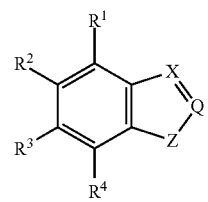

Formula I where:
Q=N, $CR^5$
X=N, $CR^6$
Z=NH, S, O, Se, Te
$R^1$ through $R^4$ can be H, F, Cl, $C_1$-$C_{24}$ alkyl, $C_2$-$C_{24}$ alkenyl, aryl, $C_1$-$C_{10}$ alkoxy, $C_1$-$C_{10}$ alkylseleno, $C_1$-$C_{10}$ alkylthio, $C_1$-$C_{10}$ alkylsilyl, $NH_2$, or $C_1$-$C_{10}$ dialkylamino, where adjacent R groups can join together to form a 5- or 6-membered aliphatic or aromatic rings, with the proviso that at least one of $R^1$ through $R^4$ is $NH_2$, and at least one of $R^1$ through $R^6$ is H, and.
$R^5$ and $R^6$ can be H, $C_1$-$C_{24}$ alkyl, $C_2$-$C_{24}$ alkenyl, and aryl. The electrically conducting polymer is doped with a non-fluorinated acid polymer.

15 Claims, 1 Drawing Sheet

U.S. PATENT DOCUMENTS

| | | | |
|---|---|---|---|
| 6,150,426 | A | 11/2000 | Curtin et al. |
| 6,303,238 | B1 | 10/2001 | Thompson et al. |
| 6,670,645 | B2 | 12/2003 | Grushin et al. |
| 7,354,532 | B2 | 4/2008 | Hsu et al. |
| 7,468,219 | B2 * | 12/2008 | Abe et al. ............. 429/523 |
| 7,727,421 | B2 | 6/2010 | Hsu et al. |
| 2002/0132164 | A1 | 9/2002 | Kaneko et al. |
| 2004/0131886 | A1 * | 7/2004 | Marrocco et al. ............. 428/690 |
| 2005/0184287 | A1 | 8/2005 | Herron et al. |
| 2005/0227081 | A1 | 10/2005 | Hsu et al. |
| 2006/0289843 | A1 | 12/2006 | Hsu et al. |
| 2007/0054151 | A1 * | 3/2007 | Iwakuma et al. ............. 428/690 |
| 2007/0170401 | A1 | 7/2007 | Hsu et al. |
| 2007/0202356 | A1 | 8/2007 | Okada |
| 2007/0298530 | A1 | 12/2007 | Feehery |
| 2008/0061685 | A1 | 3/2008 | Chesterfield |
| 2008/0191172 | A1 | 8/2008 | Hsu |

FOREIGN PATENT DOCUMENTS

| | | | |
|---|---|---|---|
| JP | 2001342242 | A1 | 12/2001 |
| WO | 98/31716 | A1 | 7/1998 |
| WO | 99/52954 | A1 | 10/1999 |
| WO | 00/70655 | A2 | 11/2000 |
| WO | 01/41512 | A1 | 6/2001 |
| WO | WO 01/43215 | * | 6/2001 |
| WO | 03/006537 | A1 | 1/2003 |
| WO | 03/008424 | A1 | 1/2003 |
| WO | 03/040257 | A1 | 5/2003 |
| WO | 03/063555 | A1 | 7/2003 |
| WO | 03/091688 | A2 | 11/2003 |
| WO | 2004/016710 | A1 | 2/2004 |
| WO | 2005/052027 | A1 | 6/2005 |

OTHER PUBLICATIONS

A Feiring et al, Macromolecules 2000, 33, 9262-9271.

DD Desmarteau, J Fluorine Chemistry, 1995, 72, 203-208.

Aj Appleby et al, J electrochem. Soc. 1993, 140(1), 109-111.

"Flexible light-emitting diodes made from soluble conducting polymer," Gustafsson et al, Nature vol. 357, pp. 477 479 (Jun. 11, 1992).

Kirk-Othmer Encyclopedia of Chemical Technology, Fourth Edition, vol. 18, p. 837-860, 1996, by Y. Wang.

International Search Report, PCT/US09/067258, PCT Counterpart of U.S. Appl. No. 12/633,903.

Skompskaa, Magdalena et al., Poly(1,8-diaminocarbazol)—A novel conducting polymer for sensor applications, Electrochemistry Communications, Apr. 2007, vol. 9, Issue 4, pp. 540-544, ISSN 1388-2481.

Ryu, Kwant Sun et al., Electrochemical performance of chemically synthesized oligo-indole as a positive electrode for lithium rechargeable batteries, Journal of Applied Electrochemistry, Apr. 2008, vol. 38, pp. 477-482, ISSN 1572-8838.

International Search Report, PCT/US09/067243, PCT Counterpart of the Present Application.

* cited by examiner

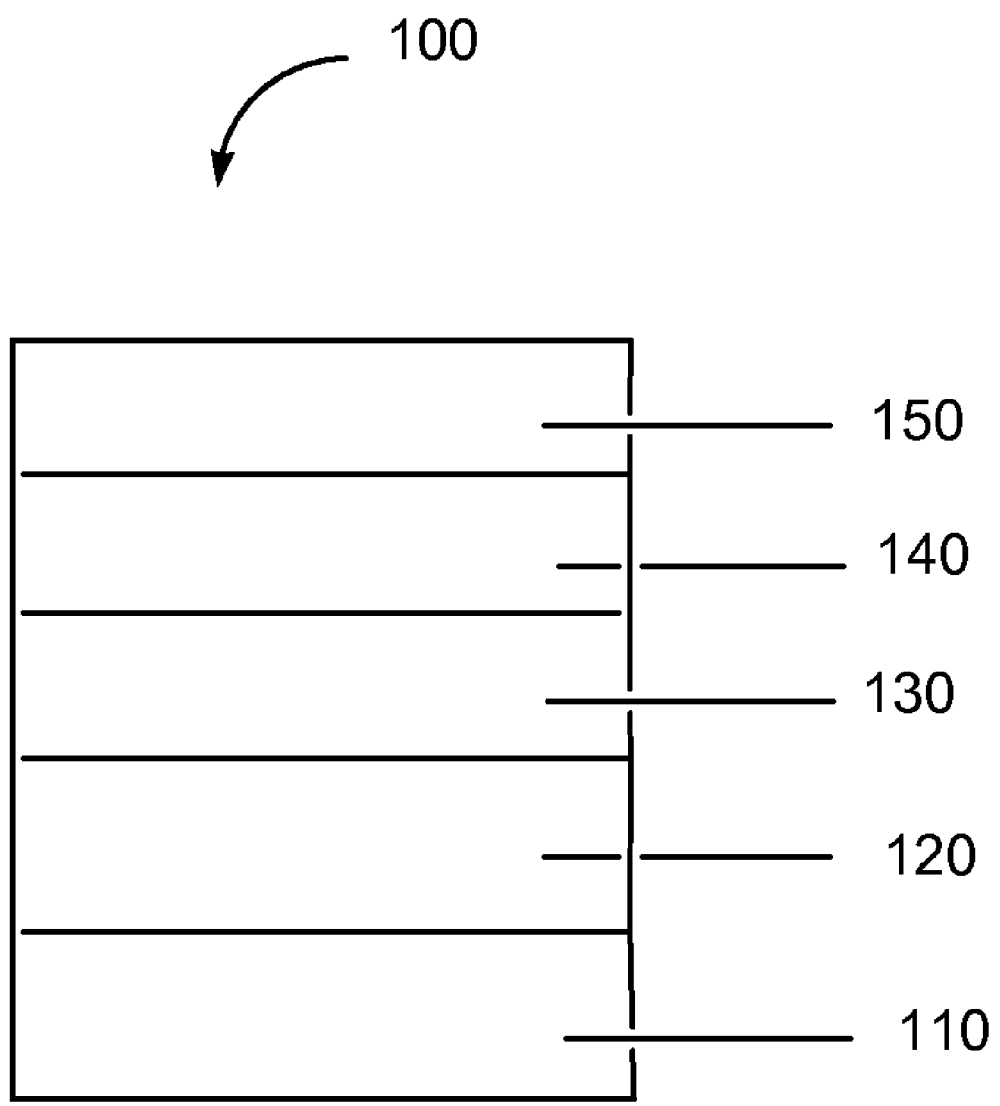

US 8,142,686 B2

ELECTRICALLY CONDUCTIVE POLYMER COMPOSITIONS

RELATED APPLICATION

This application claims priority under 35 U.S.C. §119(e) from Provisional Application No. 61/120,923 filed on Dec. 9, 2008 which is incorporated by reference in its entirety.

FIELD OF THE INVENTION

This invention relates in general to electrically conductive polymer compositions, and their use in organic electronic devices.

BACKGROUND INFORMATION

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are an organic electronic device comprising an organic layer capable of electroluminescence. OLEDs containing conducting polymers can have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly(styrenesulfonic acid) (PSS), as described in, for example, U.S. Pat. No. 5,300,575.

The aqueous electrically conductive polymer dispersions synthesized with water soluble polymeric sulfonic acids have undesirable low pH levels. The low pH can contribute to decreased stress life of an EL device containing such a buffer layer, and contribute to corrosion within the device.

Electrically conducting polymers which have the ability to carry a high current when subjected to a low electrical voltage, also have utility as electrodes for electronic devices, such as thin film field effect transistors. In such transistors, an organic semiconducting film which has high mobility for electron and/or hole charge carriers, is present between source and drain electrodes. A gate electrode is on the opposite side of the semiconducting polymer layer. To be useful for the electrode application, the electrically conducting polymers and the liquids for dispersing or dissolving the electrically conducting polymers have to be compatible with the semiconducting polymers and the solvents for the semiconducting polymers to avoid re-dissolution of either conducting polymers or semiconducting polymers. Many conductive polymers have conductivities which are too low for use as electrodes.

Thus, there is a continuing need for electrically conductive polymer compositions having improved physical and electrical properties.

SUMMARY

There is provided an electrically conductive polymer composition comprising an intrinsically conductive polymer doped with a non-fluorinated acid polymer, wherein the conductive polymer has at least one monomer unit derived from Formula I:

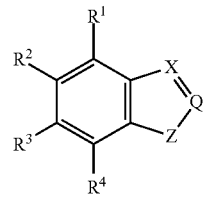

Formula I where:
$Q=N, CR^5$
$X=N, CR^6$
$Z=NH, S, O, Se, Te$
$R^1$ through $R^4$ are the same or different and are selected from the group consisting of H, F, Cl, $C_1$-$C_{24}$ alkyl, $C_2$-$C_{24}$ alkenyl, aryl, $C_1$-$C_{10}$ alkoxy, $C_1$-$C_{10}$ alkylseleno, $C_1$-$C_{10}$ alkylthio, $C_1$-$C_{10}$ alkylsilyl, $NH_2$, and $C_1$-$C_{10}$ dialkylamino, where adjacent R groups can join together to form a 5- or 6-membered aliphatic or aromatic rings, with the proviso that at least one of $R^1$ through $R^4$ is $NH_2$, and at least one of $R^1$ through $R^6$ is H, and at least one of $R^1$ through $R^6$ is H, and.
$R^5$ and $R^6$ are the same or different and are selected from the group consisting of H, $C_1$-$C_{24}$ alkyl, $C_2$-$C_{24}$ alkenyl, and aryl.

In another embodiment, the composition further comprises a fluorinated acid polymer.

In another embodiment, there is provided an aqueous dispersion of the new conductive polymer composition.

In another embodiment, there is provided a buffer layer comprising the new conductive polymer composition.

In another embodiment, electronic devices comprising at least one layer comprising the new conductive polymer composition are provided.

BRIEF DESCRIPTION OF THE DRAWINGS

FIG. 1 is a schematic diagram of an organic electronic device.

The FIGURE(s) are provided by way of example and are not intended to limit the invention.

The foregoing general description and the following detailed description are exemplary and explanatory only and are not restrictive of the invention, as defined in the appended claims.

DETAILED DESCRIPTION

In one embodiment, there is provided an electrically conductive polymer composition, comprising an intrinsically conductive polymer doped with a non-fluorinated acid polymer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Conductive Precursor Monomer, the Non-Conductive Precursor Monomer, the Non-Fluorinated Acid, Preparation of the Doped Electrically Conductive Polymer, the Fluorinated Acid Polymer, Preparation of Composite Dispersions, Buffer Layers, Electronic Devices, and finally Examples.

1. DEFINITIONS AND CLARIFICATION OF TERMS

As used herein the term "acid polymer" refers to a polymer having acidic groups.

The term "acidic group" refers to a group capable of ionizing to donate a hydrogen ion to a Brønsted base.

The term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

The term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

The term "alkoxy" refers to the group RO—, where R is alkyl.

The term "alkylseleno" refers to the group RSe—, where R is alkyl.

The term "alkylsilyl" refers to the group $R_3Si$—, where R is alkyl.

The term "alklthio" refers to the group RS—, where R is alkyl.

The term "aqueous" refers to a liquid that has a significant portion of water, and in one embodiment it is at least about 40% by weight water; in some embodiments, at least about 60% by weight water.

The term "aryl" refers to a group derived from an aromatic hydrocarbon. The term "aromatic compound" is intended to mean an organic compound comprising at least one unsaturated cyclic group having delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "buffer layer" or "buffer material" is intended to refer to electrically conductive or semiconductive layers or materials which may have one or more functions in an organic electronic device, including but not limited to, planarization of the underlying layer, charge transport and/or charge injection properties, scavenging of impurities such as oxygen or metal ions, and other aspects to facilitate or to improve the performance of an organic electronic device.

The term "charge transport," when referring to a layer, material, member, or structure is intended to mean that such layer, material, member, or structure facilitates migration of charge through the thickness of such layer, material, member, or structure with relative efficiency and small loss of charge. "Hole transport" refers to the migration of positive charge. "Electron transport" refers to the migration of negative charge. Although light-emitting materials may also have some charge transport properties, the terms "charge transport," "hole transport," and "electron transport" are not intended to include a layer, material, member, or structure whose primary function is light emission.

The term "doped" as it refers to an electrically conductive polymer, is intended to mean that the electrically conductive polymer has a polymeric counterion to balance the charge on the conductive polymer.

The term "doped conductive polymer" is intended to mean the conductive polymer and the polymeric counterion that is associated with it.

The term "electrically conductive" as it refers to a material, is intended to mean a material which is inherently or intrinsically capable of electrical conductivity without the addition of carbon black or conductive metal particles.

The term "fluorinated acid polymer" refers to a polymer having groups with acidic protons, and where at least one of the hydrogens bonded to carbon in the polymer has been replaced by fluorine.

The terms "fully-fluorinated" and "perfluorinated" are used interchangeably and refer to a compound where all of the available hydrogens bonded to carbon have been replaced by fluorine.

The term "layer" is used interchangeably with the term "film" and refers to a coating covering a desired area. The term is not limited by size. The area can be as large as an entire device or as small as a specific functional area such as the actual visual display, or as small as a single sub-pixel. Unless otherwise indicated, layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "polymer" refers to a polymer or oligomer having at least 3 repeat units. The term includes homopolymers having only one kind, or species, of monomeric unit, and copolymers having two or more different monomeric units, including copolymers formed from monomeric units of different species. The term "intrinsically conductive" refers to a material which is capable of electrical conductivity without the addition of carbon black or conductive metal particles.

Unless otherwise indicated, all groups can be unsubstituted or substituted. Unless otherwise indicated, all groups can be linear, branched or cyclic, where possible. In some embodiments, the substituents are selected from the group consisting of halide, alkyl, alkoxy, aryl, and cyano.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. In the Formulae, the letters Q, R, X, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics*, 81$^{st}$ Edition (2000).

To the extent not described herein, many details regarding specific materials, processing acts, and circuits are conventional and may be found in textbooks and other sources within the organic light-emitting diode display, lighting source, photodetector, photovoltaic, and semiconductive member arts.

2. CONDUCTIVE PRECURSOR MONOMERS

The conductive polymers suitable for the new composition are made from at least one monomer having Formula I:

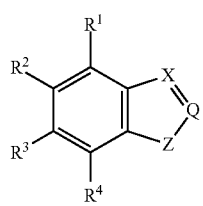

Formula I where:
Q=N, CR$^5$
X=N, CR$^6$
Z=NH, S, O, Se, Te

R$^1$ through R$^4$ are the same or different and are selected from the group consisting of H, F, Cl, C$_1$-C$_{24}$ alkyl, C$_2$-C$_{24}$ alkenyl, aryl, C$_1$-C$_{10}$ alkoxy, C$_1$-C$_{10}$ alkylseleno, C$_1$-C$_{10}$ alkylthio, C$_1$-C$_{10}$ alkylsilyl, NH$_2$, and C$_1$-C$_{10}$ dialkylamino, where adjacent R groups can join together to form a 5- or 6-membered aliphatic or aromatic rings, with the proviso that at least one of R$^1$ through R$^4$ is NH$_2$, and at least one of R$^1$ through R$^6$ is H, and R$^5$ and R$^6$ are the same or different and are selected from the group consisting of H, C$_1$-C$_{24}$ alkyl, C$_2$-C$_{24}$ alkenyl, and aryl.

In some embodiments, one of R$^1$ and R$^4$ is NH$_2$, and R$^2$ and R$^3$ are H.

In some embodiments, Z is selected from NH and S. In some embodiments, Q=X=CH.

In some embodiments, the monomer is selected from the group consisting of Formulae Ia through If:

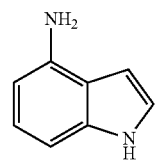

Formula Ia

Formula Ib

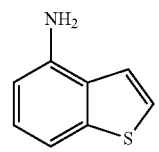

Formula Ic

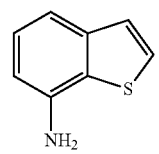

Formula Id

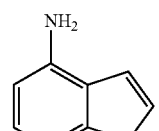

Formula Ie

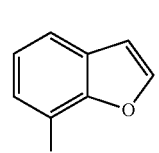

Formula If

In some embodiments, homopolymers of monomers having one of Formulae Ia through If have one of the polymeric structures shown below, or a combination thereof.

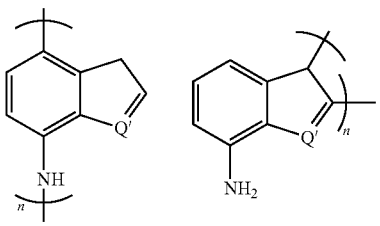

where Q' is selected from NH, O, and S.

Monomers which, when polymerized alone form homopolymers which are intrinsically conductive, are referred to as "conductive precursor monomers." Monomers which, when polymerized alone form homopolymers which are not intrinsically conductive, are referred to as "non-conductive precursor monomers." The conductive polymers suitable for the new composition can be homopolymers or copolymers. The copolymers can be made from two or more conductive precursor monomers or from a combination of one or more conductive precursor monomers and one or more non-conductive precursor monomers. The term "two or more monomers" refers to two or more separate monomers that can be polymerized together directly, and to two or more different monomers that are reacted to form a single intermediate monomer, and then polymerized. In some embodiments, the intrinsically conductive polymer will form a film which has a conductivity of at least $10^{-6}$ S/cm.

In one embodiment, the intrinsically conductive polymer is a homopolymer of a monomer having Formula I.

In one embodiment, the intrinsically conductive polymer is a copolymer of at least one first conductive precursor monomer having Formula I, and at least one second conductive precursor monomer which is different from the first conductive precursor monomer. In one embodiment, the intrinsically conductive polymer is prepared by the oxidative polymerization of one or more conductive precursor monomers.

In some embodiments, the intrinsically conductive polymer is a copolymer of a first conductive precursor monomer having Formula I, and at least one second conductive precursor monomer, which is different from the first conductive precursor monomer. In some embodiments, the second conductive precursor monomer has Formula I. In some embodiments, the second conductive precursor monomer is selected from the group consisting of thiophenes, selenophenes, tellurophenes, pyrroles, anilines, and polycyclic aromatics. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring.

3. NON-CONDUCTIVE PRECURSOR MONOMERS

In one embodiment, the intrinsically conductive polymer is a copolymer of at least one conductive precursor monomer having Formula I, as described above, and at least one non-conductive precursor monomer. Any type of non-conductive precursor monomer can be used, so long as it does not detrimentally affect the desired properties of the copolymer. In one embodiment, the non-conductive precursor monomer comprises no more than 50%, based on the total number of monomer units. In one embodiment, the non-conductive precursor monomer comprises no more than 30%, based on the total number of monomer units. In one embodiment, the non-conductive precursor monomer comprises no more than 10%, based on the total number of monomer units.

Exemplary types non-conductive precursor monomers include, but are not limited to, alkenyl, alkynyl, arylene, and heteroarylene. Examples of non-conductive monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent conductive precursor monomers, which can be the same or different, and B represents a non-conductive precursor monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional conductive precursor monomers.

4. NON-FLUORINATED POLYMERIC ACID

Any non-fluorinated polymeric acid, which is capable of doping the conductive polymer can be used.

The use of such acids with conducting polymers such as polythiophenes, polyanilines and polypyrroles is well known in the art. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof.

The amount of non-fluorinated polymeric acid present is generally in excess of that required to counterbalance the charge on the conducting polymer. In some embodiments, the ratio of acid equivalents of non-fluorinated polymeric acid to molar equivalents of conducting polymer is in the range of 1-5.

5. PREPARATION OF DOPED ELECTRICALLY CONDUCTIVE POLYMER

The new electrically conductive polymer composition is prepared by chemical polymerization of the precursor monomers in the presence of the non-fluorinated acid polymer to form a dispersion. Optionally, the pH of the dispersion can be adjusted.

Alternatively, films of the conductive polymer on a substrate can be formed by electrochemical polymerization of the precursor monomers in the presence of the non-fluorinated acid polymer.

(i) Chemical Polymerization

In one embodiment, the electrically conductive polymer composition is formed by the oxidative polymerization of the precursor monomers in the presence of the non-fluorinated acid polymer. In one embodiment, the precursor monomers comprise one type of conductive precursor monomer. In one embodiment, the precursor monomers comprise two or more different conductive precursor monomers. In one embodiment, the monomers comprise an intermediate precursor monomer having the structure A-B-C, where A and C represent conductive precursor monomers, which can be the same or different, and B represents a non-conductive precursor monomer. In one embodiment, the intermediate precursor monomer is polymerized with one or more conductive precursor monomers.

In one embodiment, the oxidative polymerization is carried out in a homogeneous aqueous solution. In another embodiment, the oxidative polymerization is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the conductive polymer doped with the fluorinated acid polymer. In one embodiment, the intrinsically conductive polymer is positively charged, and the charges are balanced by the non-fluorinated acid polymer anion.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second fluorinated acid polymer, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the non-fluorinated acid polymer, and the oxidizer is added last. In one embodiment the co-acid is added prior to the addition of the precursor monomers, followed by the addition of the non-fluorinated acid polymer, and the oxidizer is added last.

In one embodiment, the polymerization is carried out in the presence of both a co-dispersing liquid and a co-acid.

In one embodiment, a reaction vessel is charged first with a mixture of water, alcohol co-dispersing agent, and inorganic co-acid. To this is added, in order, the precursor monomers, aqueous solution or dispersion of non-fluorinated acid polymer, and an oxidizer. The oxidizer is added slowly and dropwise to prevent the formation of localized areas of high ion concentration which can destabilize the mixture. In another embodiment, the oxidizer and precursor monomers are injected into the reaction mixture separately and simultaneously at a controlled rate. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In the method of making the conductive polymer, the molar ratio of oxidizer to total precursor monomer is generally in the range of 0.1 to 2.0; and in one embodiment is 0.4 to 1.5. The molar ratio of non-fluorinated acid polymer to total precursor monomer is generally in the range of 0.2 to 5. In one embodiment, the ratio is in the range of 1 to 4. The overall solid content is generally in the range of about 1.0% to 10% in weight percentage; and in one embodiment of about 2% to 4.5%. The reaction temperature is generally in the range of about 4° C. to 50° C.; in one embodiment about 20° C. to 35° C. The molar ratio of optional co-acid to precursor monomer is about 0.05 to 4. The addition time of the oxidizer may influence particle size and viscosity. In some embodiments, the particle size can be reduced by slowing down the addition speed. In parallel, the viscosity is also reduced by slowing down the addition speed. In some embodiments, the reaction time is in the range of about 10 minutes to about 30 hours.

(ii) pH Adjustment

As synthesized, the aqueous dispersions of the doped conductive polymer generally have a very low pH. In one embodiment, the pH is adjusted to higher values, without adversely affecting the properties in devices. In one embodiment, the pH of the dispersion is adjusted to about 1.5 to about 4. In one embodiment, the pH is adjusted to between 3 and 4. It has been found that the pH can be adjusted using known techniques, for example, ion exchange or by titration with an aqueous basic solution.

In one embodiment, after completion of the polymerization reaction, the as-synthesized aqueous dispersion is contacted with at least one ion exchange resin under conditions suitable to remove decomposed species, side reaction products, and unreacted monomers, and to adjust pH, thus producing a stable, aqueous dispersion with a desired pH. In one embodiment, the as-synthesized aqueous dispersion is contacted with a first ion exchange resin and a second ion exchange resin, in any order. The as-synthesized aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions. In some embodiments, weak base ion-exchange resins can be used.

In one embodiment, the first ion exchange resin is a cation, acid exchange resin, which can be in protonic form. The second ion exchange resin is a basic, anion exchange resin. In one embodiment, the first ion exchange resin is a basic, anion exchange resin and the second ion exchange resin is a cation, acid exchange resin, which can be in protonic or metal ion, typically sodium ion, form.

Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, about one to five grams of ion exchange resin is used per gram of new conductive polymer composition.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

In another embodiment, more conductive dispersions are formed by the addition of highly conductive additives to the aqueous dispersions of the new conductive polymer composition. Because dispersions with relatively high pH can be formed, the conductive additives, especially metal additives, are not attacked by the acid in the dispersion. Examples of suitable conductive additives include, but are not limited to, metal particles and nanoparticles, nanowires, carbon nanotubes, graphite fibers or particles, carbon particles, and combinations thereof.

(iii) Electrochemical Polymerization

Electropolymerization techniques to form conductive polymers are well known in the art. Typically, a one-compartment cell containing a reaction solvent, a polymeric supporting electrolyte and the monomer will be used. The non-fluorinated acid polymer functions as the supporting electrolyte. A conventional apparatus comprises working and counter electrodes. In some cases a reference electrode is also present. Suitable working electrode materials include platinum, gold metal sheet, tin oxide on glass, indium tin oxide on glass, or other electrode materials that will allow the polymer to build up and to adhere and which will not be electrochemically corroded or damaged under the electropolymerization conditions. The working electrode can vary in shape or configuration, although a flat electrode will be preferred for the production thereon of a polymeric film. The counter electrode can be platinum, stainless steel, or other suitable material. The reference electrode can be an aqueous saturated calomel electrode or silver/silver nitrate reference electrode. Electropolymerization can be initiated by applying a potential difference between the working and counter electrodes. In some embodiments, the potential difference is 1-5 volts.

6. FLUORINATED ACID POLYMER

In some embodiments, the conductive polymer composition further comprises a fluorinated acid polymer. The fluorinated acid polymer can be any polymer which is fluorinated and has groups with acidic protons. As used herein, the term "fluorinated" means that at least one hydrogen bonded to a carbon has been replaced with a fluorine. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The group having an acidic proton, is hereinafter referred to as an "acidic group." In one embodiment, the acidic group has a pKa of less than 3. In one embodiment, the acidic group has a pKa of less than 0. In one embodiment, the acidic group has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the fluorinated acid polymer is water-soluble. In one embodiment, the fluorinated acid polymer is dispersible in water.

In one embodiment, the fluorinated acid polymer is organic solvent wettable. The term "organic solvent wettable" refers to a material which, when formed into a film, is wettable by organic solvents. The term also includes polymeric acids which are not film-forming alone, but which form an electrically conductive polymer composition which is wettable. In one embodiment, wettable materials form films which are wettable by phenylhexane with a contact angle no greater than 40°. The methods for measuring contact angles are well known.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are selected from sulfonic acid groups and sulfonimide groups. A sulfonimide group has the formula:

—SO$_2$—NH—SO$_2$—R where R is an alkyl group.

In one embodiment, the acidic groups are on a fluorinated side chain. In one embodiment, the fluorinated side chains are selected from alkyl groups, alkoxy groups, amido groups, ether groups, and combinations thereof.

In one embodiment, the fluorinated acid polymer has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the fluorinated acid polymer is a homopolymer or copolymer of monomers having Formula VII:

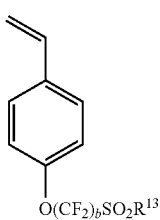

(VII)

where:

b is an integer from 1 to 5,

R$^{13}$ is OH or NHR$^{14}$, and

R$^{14}$ is alkyl, fluoroalkyl, sulfonylalkyl, or sulfonylfluoroalkyl.

In one embodiment, the monomer is "SFS" or "SFSI" shown below:

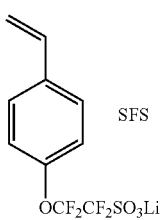 

After polymerization, the polymer can be converted to the acid form.

In one embodiment, the fluorinated acid polymer is a homopolymer or copolymer of a trifluorostyrene having acidic groups. In one embodiment, the trifluorostyrene monomer has Formula VIII:

where:

W is selected from (CF$_2$)$_b$, O(CF$_2$)$_b$, S(CF$_2$)$_b$, (CF$_2$)$_b$O(CF$_2$)$_b$, b is independently an integer from 1 to 5, R$^{13}$ is OH or NHR$^{14}$, and R$^{14}$ is alkyl, fluoroalkyl, sulfonylalkyl, or sulfonylfluoroalkyl.

In one embodiment, the fluorinated acid polymer is a sulfonimide polymer having Formula IX:

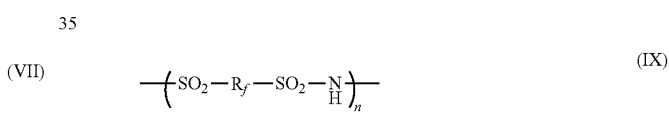

where:

R$_f$ is selected from fluorinated alkylene, fluorinated heteroalkylene, fluorinated arylene, and fluorinated heteroarylene; and n is at least 4.

In one embodiment of Formula IX, R$_f$ is a perfluoroalkyl group. In one embodiment, R$_f$ is a perfluorobutyl group. In one embodiment, R$_f$ contains ether oxygens. In one embodiment n is greater than 10.

In one embodiment, the fluorinated acid polymer comprises a fluorinated polymer backbone and a side chain having Formula X:

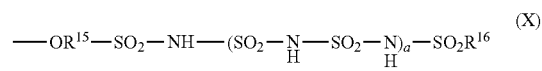

where:

R$^{15}$ is a fluorinated alkylene group or a fluorinated heteroalkylene group;

R$^{16}$ is a fluorinated alkyl or a fluorinated aryl group; and a is 0 or an integer from 1 to 4.

In one embodiment, the fluorinated acid polymer has Formula XI:

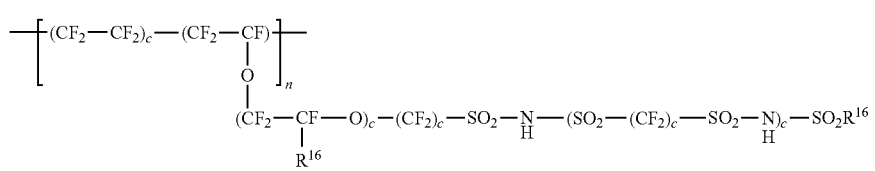

(XI)

where:

R$^{16}$ is a fluorinated alkyl or a fluorinated aryl group;

c is independently 0 or an integer from 1 to 3; and n is at least 4.

The synthesis of fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the fluorinated acid polymer comprises at least one repeat unit derived from an ethylenically unsaturated compound having the structure (XII):

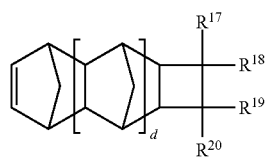

(XII)

wherein d is 0, 1, or 2;

R$^{17}$ to R$^{20}$ are independently H, halogen, alkyl or alkoxy of 1 to 10 carbon atoms, Y, C(R$_f'$)(R$_f'$)OR$^{21}$, R$^4$Y or OR$^4$Y;

Y is COE$^2$, SO$_2$ E$^2$, or sulfonimide;

R$^{21}$ is hydrogen or an acid-labile protecting group;

R$_f'$ is the same or different at each occurrence and is a fluoroalkyl group of 1 to 10 carbon atoms, or taken together are (CF$_2$)$_e$ where e is 2 to 10;

R$^4$ is an alkylene group;

E$^2$ is OH, halogen, or OR$^5$; and

R$^5$ is an alkyl group;

with the proviso that at least one of R$^{17}$ to R$^{20}$ is Y, R$^4$Y or OR$^4$Y.

R$^4$, R$^5$, and R$^{17}$ to R$^{20}$ may optionally be substituted by halogen or ether oxygen.

Some illustrative, but nonlimiting, examples of representative monomers of structure (XII) are presented below:

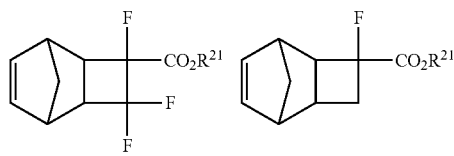

-continued

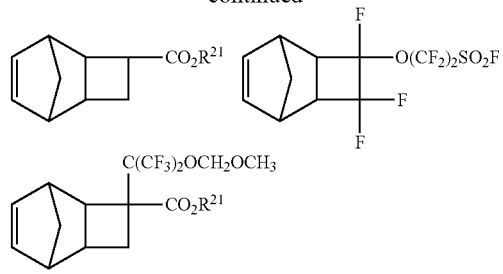

wherein R$^{21}$ is a group capable of forming or rearranging to a tertiary cation, more typically an alkyl group of 1 to 20 carbon atoms, and most typically t-butyl.

Compounds of structure (XII) wherein d=0, structure (XII-a), may be prepared by the cycloaddition reaction of unsaturated compounds of structure (XIII) with quadricyclane (tetracyclo[2.2.1.0$^{2,6}$0$^{3,5}$]heptane) as shown in the equation below.

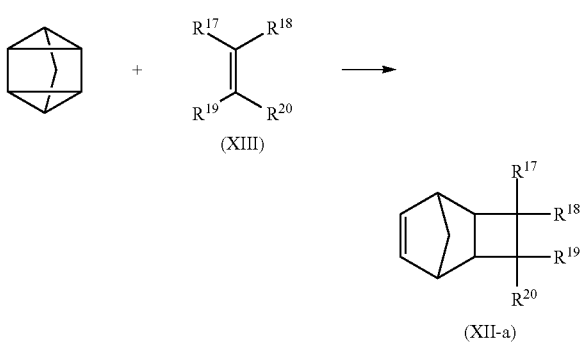

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of structure (XII) with higher values of d (i.e., d=1 or 2) may be prepared by reaction of compounds of structure (XII) with d=0 with cyclopentadiene, as is known in the art.

In one embodiment, the fluorinated acid polymer also comprises a repeat unit derived from at least one ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the fluorinated acid polymer comprises a polymeric backbone having pendant groups comprising siloxane sulfonic acid. In one embodiment, the siloxane pendant groups have the formula below:

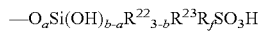

wherein:

a is from 1 to b;

b is from 1 to 3;

$R^{22}$ is a non-hydrolyzable group independently selected from the group consisting of alkyl, aryl, and arylalkyl;

$R^{23}$ is a bidentate alkylene radical, which may be substituted by one or more ether oxygen atoms, with the proviso that R23 has at least two carbon atoms linearly disposed between Si and $R_f$; and $R_f$ is a perfluoroalkylene radical, which may be substituted by one or more ether oxygen atoms.

In one embodiment, the fluorinated acid polymer having pendant siloxane groups has a fluorinated backbone. In one embodiment, the backbone is perfluorinated.

In one embodiment, the fluorinated acid polymer has a fluorinated backbone and pendant groups represented by the Formula (XIV)

$$—O_g—[CF(R_f^2)CF—O_h]_i—CF_2CF_2SO_3H \qquad (XIV)$$

wherein $R_f^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the fluorinated acid polymer has formula (XV)

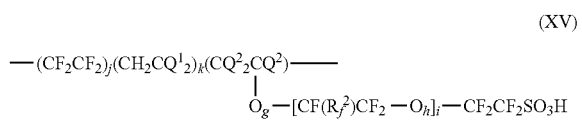

(XV)

where j≧0, k≧0 and 4≦(j+k)≦199, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1. In one embodiment $R_f^2$ is —$CF_3$, g=1, h=1, and i=1. In one embodiment the pendant group is present at a concentration of 3-10 mol-%.

In one embodiment, $Q^1$ is H, k≧0, and $Q^2$ is F, which may be synthesized according to the teachings of Connolly et al., U.S. Pat. No. 3,282,875. In another preferred embodiment, $Q^1$ is H, $Q^2$ is H, g=0, $R_f^2$ is F, h=1, and i=1, which may be synthesized according to the teachings of co-pending application Ser. No. 60/105,662. Still other embodiments may be synthesized according to the various teachings in Drysdale et al., WO 9831716(A1), and co-pending US applications Choi et al, WO 99/52954(A1), and 60/176,881.

In one embodiment, the fluorinated acid polymer is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonimide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" (or simply "sulfonate") refers to either to sulfonic acid groups or salts of sulfonic acid groups, and in one embodiment alkali metal or ammonium salts. The functional group is represented by the formula —$SO_3E^5$ where $E^5$ is a cation, also known as a "counterion". $E^5$ may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, $E^5$ is H, in which case the polymer is said to be in the "acid form". $E^5$ may also be multivalent, as represented by such ions as $Ca^{++}$, and $Al^{+++}$. It is clear to the skilled artisan that in the case of multivalent counterions, represented generally as $M^{x+}$, the number of sulfonate functional groups per counterion will be equal to the valence "x".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and R—CH=$CH_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for include a highly fluorinated, and in one embodiment perfluorinated, carbon backbone and side chains represented by the formula

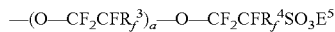

wherein $R_f^3$ and $R_f^4$ are independently selected from F, Cl or a perfluorinated alkyl group having 1 to 10 carbon atoms, a=0, 1 or 2, and $E^5$ is H, Li, Na, K or N(R1)(R2)(R3)(R4) and R1, R2, R3, and R4 are the same or different and are and in one embodiment H, $CH_3$ or $C_2H_5$. In another embodiment $E^5$ is H. As stated above, $E^5$ may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

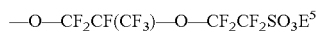

where X is as defined above. FSA polymers of this type are disclosed in U.S. Pat. No. 3,282,875 and can be made by copolymerization of tetrafluoroethylene (TFE) and the perfluorinated vinyl ether $CF_2$=$CF$—$O$—$CF_2CF(CF_3)$—$O$—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —$O$—$CF_2CF_2SO_3E^5$, wherein $E^5$ is as defined above. This polymer can be made by copolymerization of tetrafluoroethylene (TFE) and the perfluorinated vinyl ether $CF_2$=$CF$—$O$—$CF_2CF_2SO_2F$, perfluoro(3-oxa-4-pentenesulfonyl fluoride) (POPF), followed by hydrolysis and further ion exchange as necessary.

In one embodiment, the FSA polymers have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —$O$—$CF_2$—$CF(CF_3)$—$O$—$CF_2$—$CF_2$—$SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —$O$—$CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commercially as Nafion® dispersions, from E.I. du Pont de Nemours and Company (Wilmington, Del.).

Some of the polymers described hereinabove may be formed in non-acid form, e.g., as salts, esters, or sulfonyl fluorides. They will be converted to the acid form for the preparation of conductive compositions, described below.

7. PREPARATION OF THE COMPOSITE DISPERSION

An aqueous dispersion of conductive polymer doped with non-fluorinated polymeric acid and a fluorinated acid polymer ("FAP") is referred to herein as a composite dispersion of the new conductive polymer.

The composite dispersion is prepared by first forming the doped conductive polymer and then adding the FAP. The FAP can be first dissolved or dispersed in an aqueous liquid.

The FAP is present in an amount such that the acid equivalent ratio of FAP to non-fluorinated polymeric acid is at least 0.2. In some embodiments, the ratio is no greater than 2.0.

In some embodiments, the pH is increased after the addition of the FAP. The pH can be adjusted by treatment with cation exchange resins and/or base resins prior to additive addition. In some embodiments, the pH is adjusted by the addition of aqueous base solution. Cations for the base can be, but are not limited to, alkali metal, alkaline earth metal, ammonium, and alkylammonium. In some embodiments, alkali metal is preferred over alkaline earth metal cations.

In some embodiments, the dispersion of the doped conductive polymer and FAP is blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers.

The composite aqueous dispersions described herein can be formed into films. The films can be made using any liquid deposition technique, including continuous and discontinuous techniques. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

8. BUFFER LAYERS

In another embodiment of the invention, there are provided buffer layers comprising the new conductive polymer composition described herein. In some embodiments, the buffer layer consists essentially of a conductive polymer having at least one monomeric unit derived from Formula I and doped with a non-fluorinated acid polymer. In some embodiments, the buffer layer consists essentially of (a) a conductive polymer having at least one monomeric unit derived from Formula I and doped with a non-fluorinated acid polymer, and (b) a fluorinated acid polymer.

The dried films made from aqueous dispersions of the new conductive polymer compositions are generally not redispersible in water. Thus the buffer layer can be formed as multiple thin layers. In addition, the buffer layer can be overcoated with a layer of different water-soluble or water-dispersible material without being damaged.

In another embodiment, there are provided buffer layers deposited from aqueous dispersions comprising the new conductive polymer composition blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers.

9. ELECTRONIC DEVICES

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electroradiative properties. An electroactive layer material may emit radiation or exhibit a change in concentration of electron-hole pairs when receiving radiation.

As shown in FIG. 1, a typical device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 comprises the new conductive polymer composition described herein. In some embodiments, the buffer layer consists essentially of the new conductive polymer composition described herein. The layer can be formed using a variety of techniques well-known to those skilled in the art. In some embodiments, the layer is formed by deposition of aqueous dispersions of the new conductive polymer composition, as described herein, using any of the liquid deposition techniques described above.

An optional layer, not shown, may be present between the buffer layer 120 and the electroactive layer 130. This layer may comprise hole transport materials.

Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, naphthalene, anthracene, chrysene, pyrene, tetracene, xanthene, perylene, coumarin, rhodamine, quinacridone, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

Optional layer 140 is an electron transport layer. Examples of electron transport materials which can be used in the optional electron transport layer 140, include metal chelated oxinoid compounds, such as tris(8-hydroxyquinolato)aluminum (AlQ), bis(2-methyl-8-quinolinolato)(p-phenylphenolato) aluminum (BAlq), tetrakis-(8-hydroxyquinolato) hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. The electron-transport layer may also be doped with n-dopants, such as Cs or other alkali metals.

The cathode 150, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li- or Cs-containing organometallic compounds such as LiF, $Li_2O$ or CsF can also be deposited between the organic layer and the cathode layer to lower the operating voltage. This layer may be referred to as an electron injection layer.

It is understood that each functional layer can be made up of more than one layer.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110 the hole transport layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; buffer layer 120, 50-2000 Å, in one embodiment 200-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components of the invention. This is done merely for convenience and to give a general sense of the invention. This description should be read to include one or at least one and the singular also includes the plural unless it is obvious that it is meant otherwise.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

EXAMPLES

The concepts described herein will be further described in the following examples, which do not limit the scope of the invention described in the claims.

Example 1

This example illustrates the synthesis of a precursor monomer, 4-amino-indole.

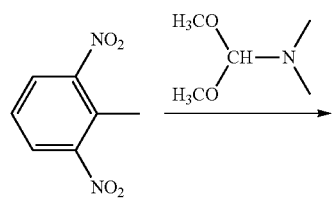

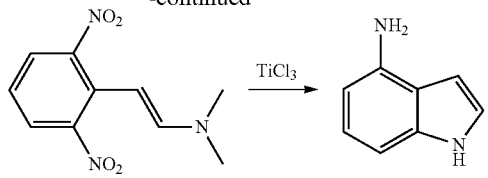

A mixture solution of 2,6-dinitrotoluene (18.2 g, 0.1 mol) and N,N-dimethylformamide dimethylacetal (28 mL, d=0.89, 0.2 mol) in anhydrous DMF (80 mL) was refluxed for 5 h. The mixture was then evaporated to concentrate to a reddish-black oil. After run flash column using $CH_2Cl_2$:MeOH (10:1) as eluent to give a red crystalline solid intermediate, 2,6-dinitro-trans-â-dimethylaminostyrene (20.5 g, yield 86%).

The red crystalline solid (11.8 g, 0.05 mol) was dissolved in acetic acid/water (2:1 mixture, 200 mL of) by heating. To this orange solution were then added slowly of $TiCl_3$ 15% in HCl 5-10% (500 mL) at room temperature. The resulting brown mixture was heated at 60° C. for about 2 h. It was quenched with water and extracted with methylene chloride to remove the starting material. The aqueous phase was neutralized with concentrated NaOH, followed by the addition of chloroform. The organic phase was washed with a saturated NaCl solution and H2O and then dried with anhydrous $Na_2SO_4$. After solvent evaporation, a brownish-red oil appeared which was purified by flash chromatography using $CHCl_3$ to yield 3.6 g of a pure light yellow crystals (59%). NMR analysis confirmed the product as 4-aminoindole.

Example 2

This example illustrates the polymerization of 4-aminoindole with a non-fluorinated acid polymer.

The non-fluorinated acid used in this polymerization with 4-aminoindole is polystyrenesulfonic acid (PSSA) in water from Alfa Aesar. It has molecular weight of 75,000 and 30% (w/w) PSSA. 0.1317 g (1.01 mmoles) 4-amino-indole from Example 1 were first added to a 50 mL Erlenmeyer flask. 9.2211 g isopropanol (IPA) were added to dissolve the monomer. To the monomer solution stirred constantly with a magnetic stirrer was added with 0.6773 g (1.10 mmoles acid equivalent) PSSA solution followed with 18.3309 g deionized water. To this was then added 0.0367 g HCl solution (36.5% HCl in water).

Before proceeding with oxidative polymerization, an oxidizing solution was made by dissolving 0.2724 g (1.2 mmoles) ammonium persulfate in 2.52 g deionized water. The oxidizing solution was added slowly to the monomer solution in about 5 minutes. It turned blue-greenish first very quickly and finally became green in half an hour. The polymerization was left proceeded for 6 days with constant stirring. It should be pointed out that there was no observable difference between the first day and the following five days. Polymerization was complete in the first 24 hours. During the entire time in 6 days, the polymerization liquid showed no sign of separation.

30.9 g of the polymerization liquid were first diluted with 15.0 g IPA/water (30/70 in weight ratio) because it was more viscous than the monomer solution prior to the addition of the oxidizing solution. The diluted polymerization liquid was then added with 7.22 g Amberlyst 15 proton exchange resin and 7.06 g Dowex 550A hydroxide anionic exchange resin. The two resins were prewashed with water and IPA until no color present in the wash. The resin containing polymerization liquid was then left stirred in a twin roller for 3.5 hours before filtered with a Whatman #4 filter paper. A film cast from the polymerization liquid shows a broad plateau at 520 to 820 nm. The absorption plateau has a broad tail extending to about 2,000 nm. Since the polymerization liquid has a much higher viscosity than the monomer solution and has a strong absorption at visible and near infrared region, the monomer has converted into poly(4-amino-indole) doped with polystyrenesulfonic acid.

29.8 g of the polymer dispersion treated with 3.12 g Amberlyst 15 and Dowex 550A was further treated with 3.0 g Amberlyst 15 for 17 hours. The polymer dispersion, which has a pH of 2.0 and solid % of 0.65, remains stable showing no sign of separation. It was used as a buffer layer for device testing with a blue emitter. The device data is shown in Example 3.

Example 3

This example illustrates the device performance of a blue emitter using poly(4-amino-indole)/PSSA as a buffer layer The poly(4-amino-indole)/PSSA made in Example 2 was used here to form a buffer layer by spin-coating on patterned ITO substrates (device active area=2.24 mm×2.5 mm). The ITO substrates were cleaned and treated in a UV-zone oven for 10 minutes before use. Spin-coating was set at 550 rpm/sec acceleration and kept at the speed for one minute. The substrates containing the buffer layer material were then baked at 140° C. for 7 minutes. Thickness of the buffer layer is ~50 nm. They were then transferred to a dry box, in which all further top coating were conducted in an inert chamber. The buffer layer was then top-coated with a 0.38% (w/v) toluene solution of HT-1, which is an arylamine-containing copolymer having hole transport properties, to achieve 20 nm thickness after baking at 275° C. for 30 mins. After cooling, the samples were placed into a high vacuum chamber. A 32 nm thick emissive layer containing 6:1 fluorescent host:fluorescent dopant was deposited by thermal evaporation, followed sequentially by a 10 nm thick metal quinolate derivative as electron transporting layer, a 0.8 nm layer of CsF as electron injection layer, and finally 100 nm aluminum cathode layer. The devices were encapsulated using a glass lid, getter pack, and UV curable epoxy.

The devices were then measured for initial current, voltage, luminance and color coordinate properties. Finally, lifetime of the devices was examined by subjecting them to constant current for a prolonged time period while monitoring luminance and voltage change. The resulting device performance data is listed in Table 1.

| Sample | Current Efficiency (cd/A) | Quantum efficiency (%) | CIEY | V (volt) | T50 (h) @display luminance |
|---|---|---|---|---|---|
| Poly(4-amino-indole)/PSSA | 4.4 | 4.5 | 0.1129 | 6.1 | 81 @505 nits |

All data @ 1000 nits unless noted;
CIEY = y color coordinate according to the C.I.E. chromaticity scale (Commision Internationale de L'Eclairage, 1931);
T50 (h) = time to half luminance in hours @ 24° C.

Example 4

This example illustrates the preparation of poly(4-amino-indole)/PSSA mixed with a highly fluorinated acid polymer The highly fluorinated acid polymer used in this example is a copolymer of TFE (tetrafluoroethylene) and PSEPVE (3,6-dioxa-4-methyl-7-octenesulfonic acid. The TFE/PSEPVE copolymer exists as nano-particles in aqueous dispersion liquid, having an average particle size of ~5 nm based on light scattering. The TFE/PSEPVE dispersion was made using a procedure similar to the procedure in U.S. Pat. No. 6,150,426, Example 1, Part 2, except that the temperature was approximately 270° C.

5.0052 g of the poly(4-amino-indole)/PSSA made in Example 2, which has solid % of 0.65, was added to 0.3459 g of the TFE/PSEPVE dispersion (10.95%). The acid equivalent ratio of TFE/PSEPVE to PSSA was 0.41 to 1. The mixture formed a stable, smooth dispersion with no sign of separation. The dispersion mixture also formed a smooth film cast on a microscope slide.

Example 5

The example illustrates the preparation of a conductive polymer doped with a non-fluorinated acid polymer by electropolymerization of 4-amino-indoles onto ITO glass substrate. 25 mg of 4-amino-indole, and 0.133 mL of 30 wt % poly(sodium 4-styrenesulfonate) in water were mixed with 4.87 mL H2O. The sodium styrenesulfonate polymer from Aldrich has Mw of 70,000. The mixture was then sonicated for 30 sec to ensure clear dispersion of the 4-amino-indole before electropolymerization. A 2'×2' stainless steel (cathode) and a 2'×2' ITO glass plate (anode) were inserted in a parallel fashion into each of the two slots in a rectangular cell containing the 5 mL electropolymerization solution. Configuration of the cell is shown in FIG. 1) A potential difference of 3.0 V was applied between the two electrodes. After 1 minute, the electro polymerization was stopped, and the ITO plate was taken out of the cell, rinsed with de-ionized water and dried in air. The electro-polymerized film on the ITO had a distinct green color. It showed a broad, distinct absorption peak at 696 nm and a second broad peak at 1,215 nm in the visible/near-infrared region after subtraction of ITO/glass background. The absorption peaks clearly show that the deposited material of the layer on ITO is a polymer.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A polymer composition comprising an intrinsically conductive polymer doped with a non-fluorinated acid polymer, wherein the conductive polymer has at least one monomer unit derived from Formula I:

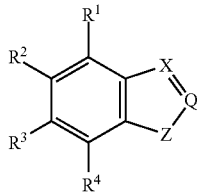

Formula I where:

Q=N, CR$^5$

X=N, CR$^6$

Z=NH, S, O, Se, Te

R$^1$ through R$^4$ are the same or different and are selected from the group consisting of H, F, Cl, C$_1$-C$_{24}$ alkyl, C$_2$-C$_{24}$ alkenyl, aryl, C$_1$-C$_{10}$ alkoxy, C$_1$-C$_{10}$ alkylseleno, C$_1$-C$_{10}$ alkylthio, C$_1$-C$_{10}$ alkylsilyl, NH$_2$, and C$_1$-C$_{10}$ dialkylamino, where adjacent R groups can join together to form a 5- or 6-membered aliphatic or aromatic rings, with the proviso that at least one of R$^1$ through R$^4$ is NH$_2$, and at least one of R$^1$ through R$^6$ is H, and;

R$^5$ and R$^6$ are the same or different and are selected from the group consisting of H, C$_1$-C$_{24}$ alkyl, C$_2$-C$_{24}$ alkenyl, and aryl.

2. The composition of claim 1, wherein one of R$^1$ and R$^4$ is NH$_2$, and R$^2$ and R$^3$ are H.

3. The composition of claim 1, wherein Z is selected from NH and S.

4. The composition of claim 1, wherein Q=X=CH.

5. The composition of claim 1, wherein the monomer unit is derived from a monomer is selected from the group consisting of Formulae Ia through If:

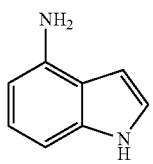

Formula Ia

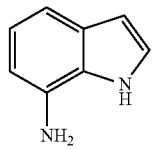

Formula Ib

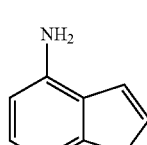

Formula Ic

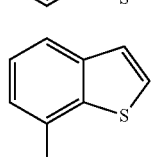

Formula Id

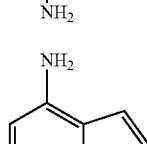

Formula Ie

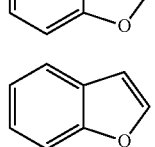

Formula If

6. The composition of claim 1, wherein the non-fluorinated acid polymer is selected from the group consisting of poly(styrenesulfonic acid), poly(2-acrylamido-2-methyl-1-propanesulfonic acid), and mixtures thereof.

7. The composition of claim 1, further comprising a fluorinated acid polymer.

8. The composition of claim 7, wherein the fluorinated acid polymer has a fluorinated olefin backbone and pendant groups selected from the group consisting of fluorinated ether sulfonate, fluorinated ester sulfonate, fluorinated ether sulfonimide, and combinations thereof.

9. The composition of claim 7, wherein the fluorinated acid polymer is selected from the group consisting of a copolymer of 1,1-difluoroethylene and 2-(2,2-difluoro-2-(trifluoromethyl)allyloxy)-1,1,2,2-tetrafluoroethanesulfonic acid; a copolymer of ethylene and 2-(2-(1,2,2-trifluorovinyloxy)-1,1,2,3,3,3-hexafluoropropoxy)-1,1,2,2-tetrafluoroethanesulfonic acid; and combinations thereof.

10. The composition of claim 7, wherein the fluorinated acid polymer has Formula XI:

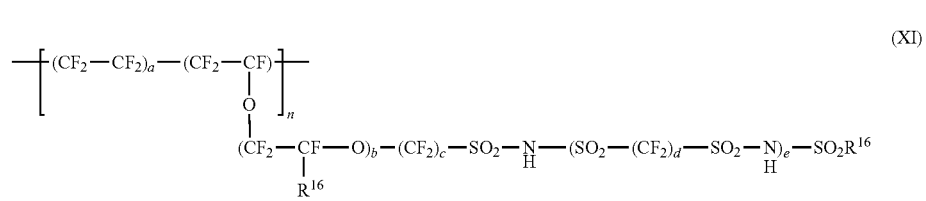

(XI)

where:

$R^{16}$ is a fluorinated alkyl or a fluorinated aryl group;

a, b, c, d, and e are each independently 0 or an integer from 1 to 3; and n is at least 4.

11. The composition of claim 7, wherein the fluorinated acid polymer is a copolymer of TFE (tetrafluoroethylene) and PSEPVE (3,6-dioxa-4-methyl-7-octenesulfonic acid.

12. An aqueous dispersion of the composition of claim 1.

13. An aqueous dispersion of the composition of claim 7.

14. An electronic device comprising at least one buffer layer comprising the polymer composition of claim 1.

15. An electronic device comprising at least one buffer layer comprising the polymer composition of claim 7.

* * * * *